United States Patent [19]
Burrows et al.

[11] Patent Number: 6,145,673
[45] Date of Patent: Nov. 14, 2000

[54] WAFER TRANSFER CASSETTE

[75] Inventors: Brian H. Burrows, San Jose, Calif.; Joseph A. Kraus; Gregory S. Verdict, both of Austin, Tex.

[73] Assignee: Applied Materials, Inc., Santa Clara, Calif.

[21] Appl. No.: 09/282,586

[22] Filed: Mar. 31, 1999

[51] Int. Cl.$^7$ .................................................. A47G 19/08
[52] U.S. Cl. ..................................... 211/41.18; 211/41.12
[58] Field of Search ............................. 211/41.18, 41.12, 211/135, 153

[56] References Cited

U.S. PATENT DOCUMENTS

| | | | |
|---|---|---|---|
| 3,851,981 | 12/1974 | Corsi et al. | 312/140 X |
| 4,228,902 | 10/1980 | Schulte | 211/41.18 |
| 5,454,677 | 10/1995 | Grant et al. | 411/427 |
| 5,472,099 | 12/1995 | Terashima | 211/41.18 |
| 5,577,621 | 11/1996 | Yi | 211/41.18 |
| 5,704,494 | 1/1998 | Nishikiori et al. | 211/41.18 X |

*Primary Examiner*—Daniel P. Stodola
*Assistant Examiner*—Erica B. Harris

*Attorney, Agent, or Firm*—Blakely Sokoloff Taylor & Zafman

[57] ABSTRACT

A wafer transfer cassette of the kind which includes a support frame, a first wafer supporting construction, and a second wafer supporting construction. The support frame includes first and second vertically extending support structures which are horizontally spaced from one another. The first wafer supporting construction includes a first bracket portion and a first fin portion extending from the first bracket portion. The first bracket portion is mounted to the first support structure in a position wherein the first fin portion extends from the first bracket portion towards the second support structure. The second wafer supporting construction includes a second bracket portion and a second fin portion extending from the second bracket portion. The second bracket portion is mounted to the second support structure in a position wherein the second fin portion extends from the second support structure towards the first support structure. The first and second fin portions have upper surfaces positioned relative to one another to jointly support a wafer in substantially a horizontal orientation.

6 Claims, 4 Drawing Sheets

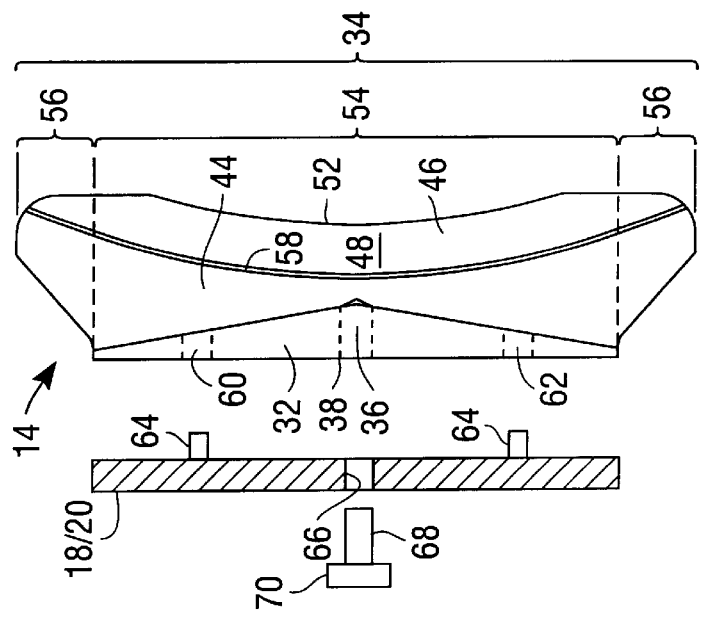
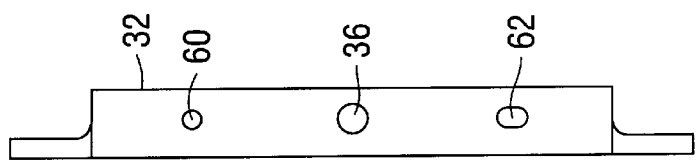
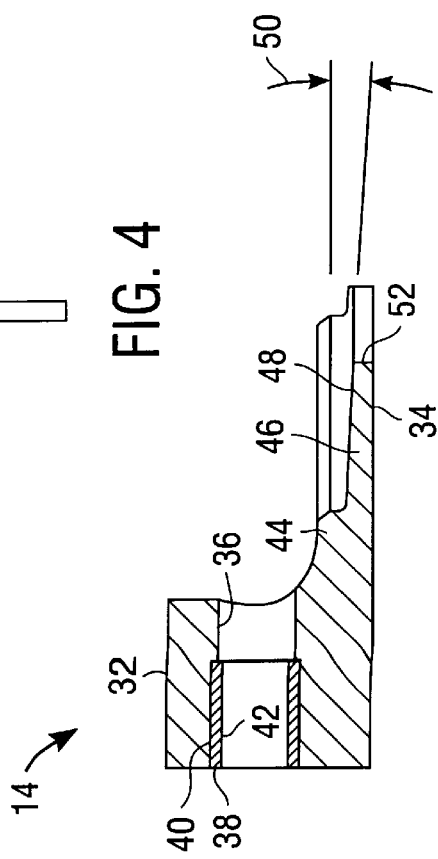
FIG. 3
FIG. 4
FIG. 2

WAFER TRANSFER CASSETTE

BACKGROUND OF THE INVENTION

1). Field of the Invention

This invention relates to a wafer transfer cassette.

2). Discussion of Related Art

Integrated circuits are manufactured in or on silicon or other semiconductor wafers. During processing of a wafer one or more steps involves inserting the wafer into a processing chamber which is maintained at a relatively high temperature and depositing a layer on the wafer.

A plurality of wafers are usually located one above the other in a transport cassette which is then positioned adjacent a factory integration unit. A robot within the factory integration unit transfers the wafers one by one through the factory integration unit to a load lock. A wafer transfer cassette is located within the load lock and the wafers are located one above the other in the wafer transfer cassette. A door is then closed between the factory integration unit and the load lock, whereafter a slit valve between the load lock and a transfer chamber is opened. The wafers are then transferred from the wafer transfer cassette through the transfer chamber into a processing chamber. The wafer is heated within the processing chamber which may be maintained at a temperature of more than 800° C. The wafer is then transferred, sometimes via a cool-down chamber, to the transfer chamber, and from the transfer chamber back onto the wafer transfer cassette located within the load lock. When the wafer is located on the wafer transfer cassette, its temperature may be as high as 200° C.

Because of the heat of the wafer, the wafer transfer cassette is usually subjected to the high temperatures from the wafer. The wafer transfer cassette is also subjected to corrosive chemicals passing from the processing chamber through the transfer chamber to the load lock. The wafer transfer cassette therefore has to be designed with these conditions in mind.

One typical wafer transfer cassette comprises a frame having first and second vertically extending support structures that are horizontally spaced from one another. Fins are provided on surfaces of the support structures. Each support structure and its fins are integrally manufactured in a casting or machining operation from a single material such as aluminum or stainless steel. A metal such as aluminum or stainless steel has superior strength characteristics when compared to, for example, a plastics material, thus providing the required strength to the wafer transfer cassette. Metal fins, however, give off particles on lower surfaces of wafers that they support, especially in corrosive conditions. These metal particles can diffuse through the wafer and destroy an integrated circuit formed thereon.

Other wafer cassettes, typically wafer transport cassettes that are used for transporting wafers from location to location in a fabrication environment, have support structures and fins that are integrally formed in a casting operation from a plastics material. Thus far the industry has shied away from using plastic wafer transfer cassettes because of inferior structural and thermal characteristics because, it is believed, that fins on such wafer transfer cassettes would buckle or bend when a wafer is located thereon and the fins are subjected to high temperatures. Buckling and bending is particularly problematic when larger, heavier wafers are located thereon.

SUMMARY OF THE INVENTION

In general, the invention provides a wafer transfer cassette of one material, and a wafer support of another material such as a plastics material. More specifically, the invention provides a wafer transfer cassette of the kind which includes a support frame, a first wafer supporting construction, and a second wafer supporting construction. The support frame includes first and second vertically extending support structures which are horizontally spaced from one another. The first wafer supporting construction includes a first bracket portion and a first fin portion extending from the first bracket portion. The first bracket portion is mounted to the first support structure in a position wherein the first fin portion extends from the first bracket portion towards the second support structure. The second wafer supporting construction includes a second bracket portion and a second fin portion extending from the second bracket portion. The second bracket portion is mounted to the second support structure in a position wherein the second fin portion extends from the second support structure towards the first support structure. The first and second fin portions have upper surfaces positioned relative to one another to jointly support a wafer in substantially a horizontal orientation.

According to one aspect of the invention the first support structure has a first engaging formation and the first bracket has a second engaging formation and the first and second engaging formations are complementarily interengaged with one another so as to mount the first wafer supporting construction to the first support structure.

One of the engaging formations may, for example, be a fastener having a threaded shank and the other engaging formation may, for example, be a threaded hole.

One of the engaging formations may be a pin and the other engaging formation may be an opening.

According to another aspect of the invention the first wafer supporting construction may be made of a different material than the first support structure.

At least the material of the upper surface of the first wafer supporting construction may be a non-metal, and, in particular, preferably contains substantially no metal. At least the material of the upper surface of the first wafer supporting construction may, for example, be a plastics material.

The engaging formation may be a first fastener having a threaded shank. The first bracket portion may have an opening formed therein and the second engaging formation may be a ring, in the opening, having an outer surface which engages with the opening, and an inner surface which is threaded and thereby engages with the threaded shank.

The first wafer supporting construction may, for example, be made of a material such as poly ethyl ethyl ketone, polybenzimidazole, or polyphenylene, and is preferably made of poly ethyl ethyl ketone.

In either case, the upper surface of the first fin portion preferably slopes downwardly from the first bracket portion towards the second support structure.

The first support structure is preferably made of a metal and a first wafer supporting construction is preferably made of a non-metal.

According to another aspect of the invention, a wafer supporting construction for a wafer transfer cassette is provided which includes a bracket portion, and a fin portion. The bracket portion has an engaging formation which is complementarily engagable with an engaging formation on a vertically extending support structure to mount the bracket portion to the support structure. The fin portion extends from the bracket portion and has a surface capable of supporting a wafer.

According to a further aspect of the invention, a method of constructing a wafer transfer cassette is provided. A bracket portion of a wafer supporting construction is mounted to a vertically extending support structure of the wafer transfer cassette. In such as position the fin portion of the wafer supporting construction extends substantially horizontally from the bracket portion and has an upper surface capable of supporting a wafer.

BRIEF DESCRIPTION OF THE DRAWINGS

The invention is further described by way of example with reference to the accompanying drawings wherein:

FIG. 2 is a cross-sectional end view of one wafer supporting construction forming part of the wafer transfer cassette;

FIG. 3 is a plan view of the wafer supporting construction, further illustrating in cross section a support structure and one fastener forming part of the wafer transfer cassette;

FIG. 4 is a side view of the wafer supporting construction;

DETAILED DESCRIPTION OF THE INVENTION

An embodiment of the present invention is described which is for a wafer transfer cassette having a support frame and a plurality of wafers supporting constructions mounted thereto. The support frame is made of aluminum which provides the necessary rigidity thereto. The wafer supporting constructions, on the other hand, are separately manufactured from poly ethyl ethyl ketone and then mounted to the frame. The material of the wafer supporting constructions does not give off metal particles on lower surfaces of wafers which they support. Regardless of the choice of material of the wafer supporting constructions, they are designed to be capable of carrying large, heavy wafers, even at high temperatures.

Figure 1:
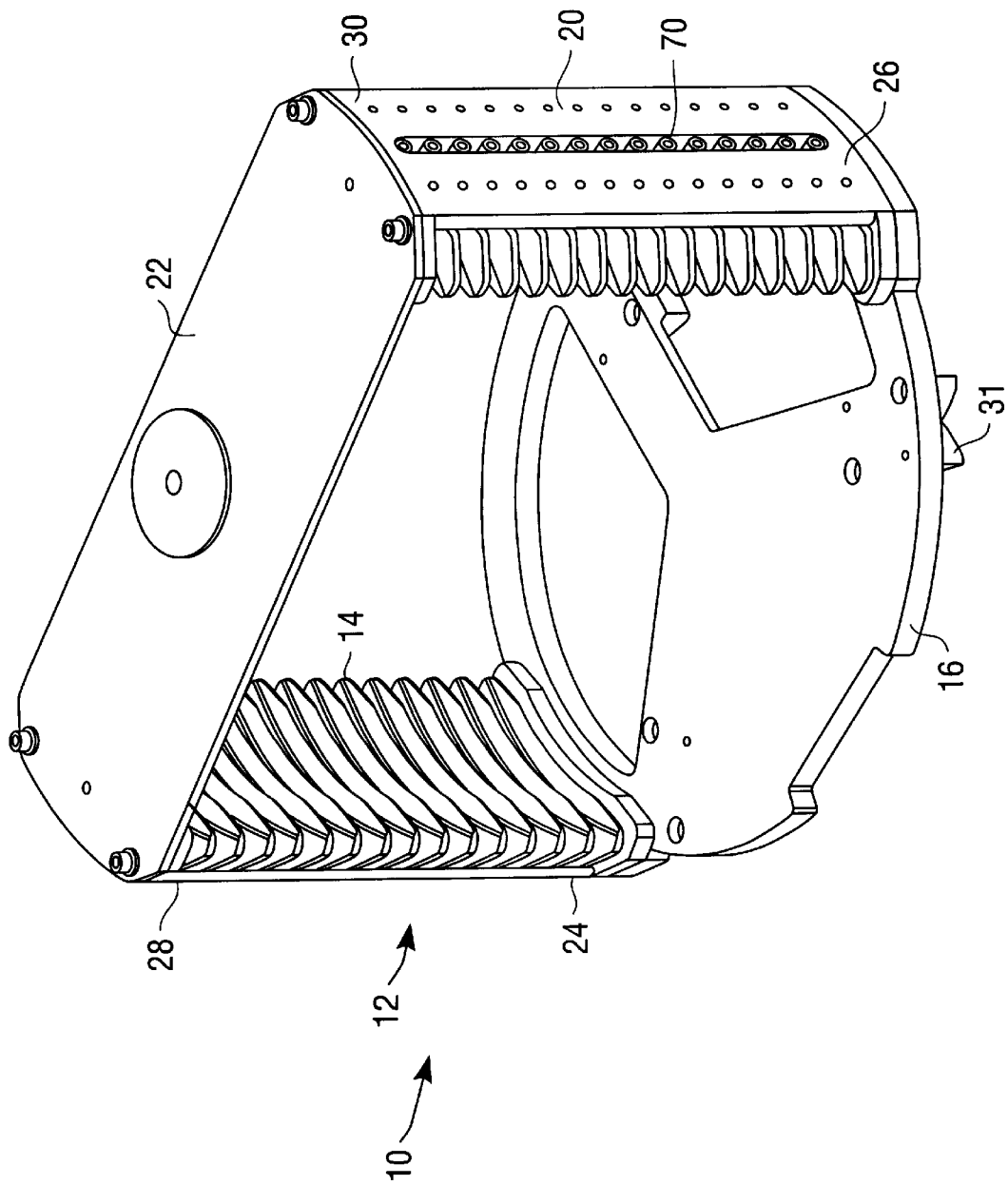
FIG. 1 is a perspective view of a wafer transfer cassette according to an embodiment of the invention.

FIG. 1 of the accompanying drawings illustrates a wafer transfer cassette 10, according to an embodiment of the invention, which includes a support frame 12 and a plurality of wafer supporting constructions 14.

The support frame 12 includes a base plate 16, first and second support structures 18 and 20, respectively, and a top plate 22. A lower end 24 of the first support structure 18 is secured on one side of the base plate 16 and the first support structure 18 extends vertically upwardly therefrom. A lower end 26 of the second support structure 20 is secured to the base plate 16 on a side thereof opposing the first support structure 18 and the second support structure extends vertically upwardly therefrom so that the first and second support structures 18 and 20 are horizontally spaced from one another.

An upper end 28 of the first support structure 18 is secured to the top plate 22 on one side of the top plate 22, and an upper end 30 of the second support structure 20 is secured to the top plate 22 on a side thereof opposing the first support structure 18, thereby finalizing the construction of the support frame 12. Three v-blocks 31 are secured to a lower surface of the base plate.

The base plate 16, the support structures 18 and 20, and the top plate 22 are all made of aluminum. A metal such as aluminum is sufficiently strong to provide the necessary strength and rigidity to the support frame 12.

FIG. 2 is a cross sectional side view of one of the wafer supporting constructions 14. The wafer supporting construction 14 is shown in FIG. 2 in an orientation in which it is mounted to one of the support structures 18 or 20 of FIG. 1.

The wafer supporting construction 14 is typically molded or machined out of a material which is preferably a non-metal and preferably includes substantially no metal. Certain plastic materials such as poly ethyl ethyl ketone, polybenzimidazole, and polyphenylene may for example be used. Poly ethyl ethyl ketone is the material of the embodiment which is now further described.

The wafer supporting construction 14 includes a bracket portion 32 and a fin portion 34. The bracket portion 32 is relatively thick and the fin portion 34 is relatively thin and extends horizontally from a lower part of the bracket portion 32.

The bracket portion 32 has an opening 36 formed horizontally therethrough. A metal ring 38 is inserted into the opening 36. The ring 38 has an outer surface 40 which is threaded and threadably engages with thread in the opening 36 so that the ring 38 is located within the opening 36. An inner surface 42 of the ring 38 is threaded.

The fin 34 includes a thicker portion 44 near the bracket portion 32 and a thinner portion 46 on a side of the thicker portion 44 opposing the bracket portion 32. The thinner portion 46 has an upper surface 48 which slopes downwardly in a direction away from the bracket portion 32 at an angle 50 of about 2.5 degrees below horizontal. The thicker portion 44 is about 3.3 millimeters thick and the thinner portion 46 has a tip 52 which is only about 1.2 millimeters thick. Referring now to FIG. 3, it can be seen that the fin portion 34 includes a central wafer supporting portion 54 which is secured directly to the bracket portion 32, and two additional wafer supporting portions 56 on opposing sides of the central wafer supporting portion. The additional wafer supporting portions 56 are not directly secured to the bracket portion 32, but are secured to the central wafer supporting portion 54 only. Each additional wafer supporting portion 56 extends from the central wafer supporting portion 54 by a distance of about 14 millimeters only.

The tip 52 has a radius of less than 150 millimeters and a step 58 between the thicker portion 44 and the thinner portion 46 has a radius of more than 150 millimeters.

First and second openings 60 and 62 are formed through the bracket portion 32 and are located on opposing sides of the opening 36.

As can be seen in FIG. 4, the first opening 60 is perfectly round and the second opening 62 is in the form of a slot which is elongate in the direction from the second opening 62 towards the first opening 60.

Referring again to FIG. 3, round pins 64 are located on the first and second support structures 18 and 20, and holes 66 are formed therethrough. The pins 64 are aligned with the openings 60 and 62 and the bracket portion 32 is brought into contact with the support structure 18 or 20. The shape of the second opening 62 allows for play in a horizontal direction but not in a vertical direction. One of the holes 66 is aligned with the opening 36 so that a threaded shank 68 of a fastener 70 may be inserted through the hole 66 and be threadably engaged with the inner surface 42 of the ring 38, thereby mounting the bracket portion 32 to the support structure 18 or 20. The ring 38 ensures that the threaded shank 68 does not damage the softer bracket portion 32.

Figure 5:
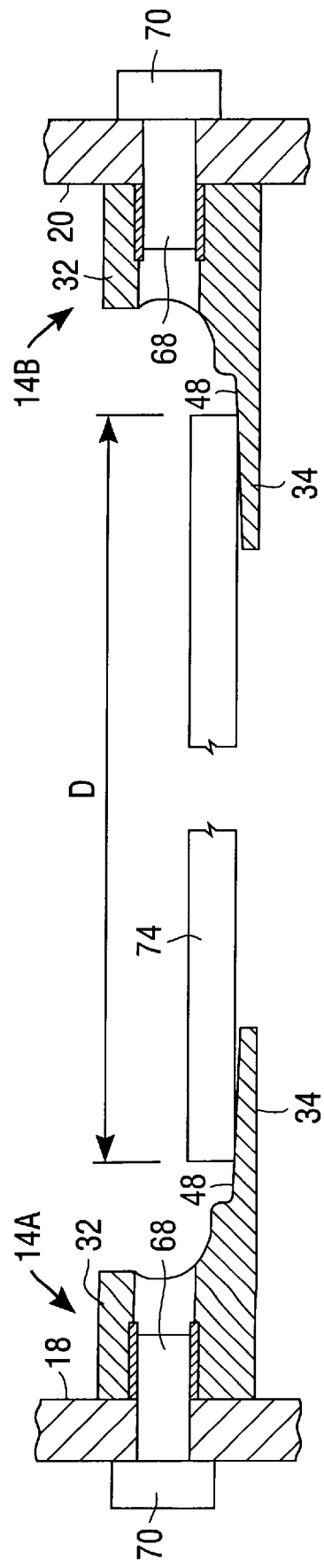
FIG. 5 is a cross-sectional side view illustrating a part of the wafer transfer cassette, including two of the wafer supporting constructions which support a wafer.

FIG. 5 illustrates a first and a second of the wafer supporting constructions 14A and 14B mounted respectively to the first support structure 18 and the second support structure 20. The fin portion 34 of the first wafer supporting construction 14A extends horizontally from the bracket portion 32 thereof towards the second support structure 20. The fin portion 34 of the second wafer supporting construction 14B extends horizontally from the bracket portion 32 thereof towards the first support structure 18.

A wafer 74 having a diameter D of 300 millimeters is supported on one side thereof by the upper surface 48 of the fin portion 34 of the first wafer supporting construction 14A, and on an opposing side thereof by the upper surface 48 of the fin portion 34 of the second wafer supporting construction 14B. The wafer 74 is so supported in substantially a horizontal orientation by means of the fin portions 34. Because of the sloped nature of the upper surfaces 48, only very small edge regions of the wafer 74 contact the upper surfaces 48 thus substantially reducing scratching on a lower surface of the wafer 74.

Although only two wafer supporting constructions are shown in FIG. 5, it should be evident from FIG. I that the wafer supporting constructions are mounted in sets, above one another, to the support frame 12, each set including a respective first wafer supporting construction mounted to the first support structure 18, and a respective second wafer supporting construction mounted to the second support structure 20.

Figure 6:
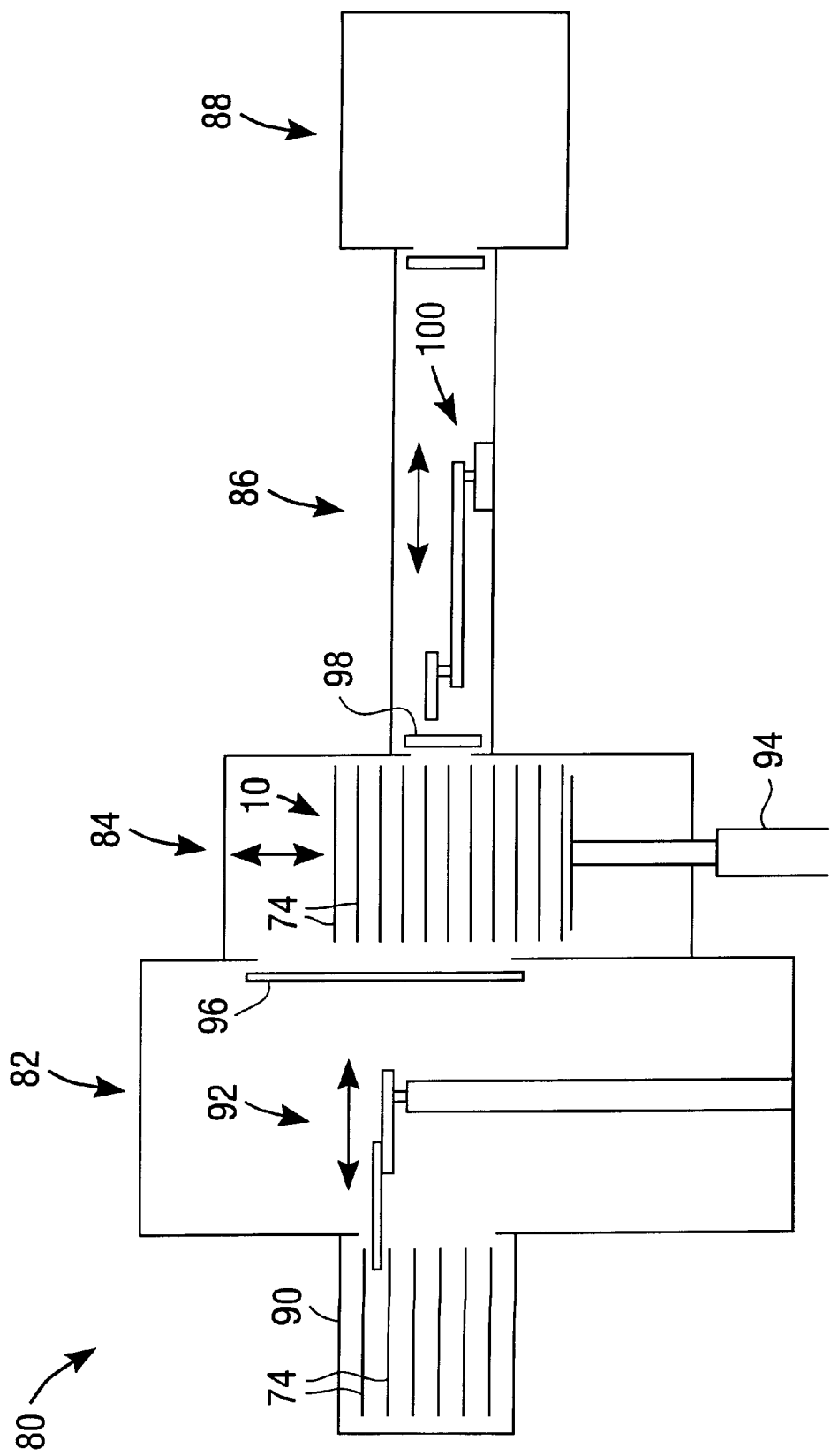
FIG. 6 is a side view which illustrates a system for processing a wafer in which the wafer transfer cassette is used.

FIG. 6 illustrates a system 80 for processing a wafer in which the wafer transfer cassette 10 of FIG. 1 is typically used. The system 80 includes a factory integration unit 82, one or more load locks 84, a transfer chamber 86, and one or more processing chambers 88.

Confines of the processing chambers 88 are maintained at relatively high temperatures. For example, when an epitaxial silicon layer has to be formed on a wafer, at least one of the processing chambers 88 may be maintained at a temperature of at least 800- C. The processing chambers lead directly off the transfer chamber 86 so that corrosive gasses used in the processing chamber tend to reach the confines of the transfer chamber 86. The transfer chamber 86 in turn leads directly off the load locks 84 so that the corrosive chemicals usually also reach the confines of the load locks 84.

A transport cassette 90 containing a number of wafers 74 is located adjacent the factory integration unit 82. A first robot 92 is located within the factory integration unit 82 and is used for transporting the wafers 74 one at a time into the factory integration unit 82 and from the factory integration unit 82 into the load locks 84. The wafer transfer cassette 10 is located within one of the load locks 84 and can be elevated or lowered by means of a cylinder 94 which interfaces with the transfer cassette 10 through a table and the v-blocks 31 (FIG. 1). By elevating or lowering the wafer transfer cassette 10, and operating the first robot 92, the wafers 74 can be located one at a time on respective sets of the wafer supporting constructions, as discussed with reference to FIG. 5 and FIG. 1.

Once the required number of wafers 74 are located on the wafer transfer cassette 10, a door 96 closes off communication between the factory integration unit 82 and the load lock 84. A slit valve 98 between the load lock 84 and the transfer chamber 86 is then opened, thus exposing the confines of the load lock 84 to the corrosive gasses within the transfer chamber 86. Because of the selection of material of the wafer supporting constructions 14, the material thereof does not react with the gasses or corrode to the extent that a metal would.

A second robot 100 then transfers the wafers 74 located on the wafer transfer cassette 10 from the wafer transfer cassette 10 into the transfer chamber 86, and then from the transfer chamber 86 into one of the processing chambers 88, and then, if necessary, from one of the processing chambers 88 to another. The wafers 74 are then heated and processed within the processing chambers 88 typically at a temperature above 800° C. Once the wafers have been processed, they are again returned, through the transfer chamber 86 to the wafer transfer cassette 10.

Once the wafers are located on the wafer transfer cassette 10, they may be at a temperature as high as 200° C. The use of a plastics material such as poly ethyl ethyl ketone, or the other materials previously mentioned, results in no metal contamination of the wafers 74. Because of no metal contamination of the wafers 74, there is no metal diffusion through the wafer as is often the case when metal fins are used. Because of no metal diffusion through the wafers 74, there is a substantially reduced likelihood that circuits formed on the wafers 74 may be destroyed because of materials used for supporting the wafers 74.

It should be noted that the material of the wafer supporting constructions 14 is selected as a high temperature engineering plastics material which is generally capable of withstanding a temperature of at least 200° C. without permanent deformation with the high temperatures of the wafers 74 in mind. Since the wafer supporting constructions 14 are made of poly ethyl ethyl ketone, they can typically withstand temperatures of at least 250° C. without destruction. The specific design of the wafer supporting construction 14 is such that a wafer having a diameter of 300 mm, and which is therefore relatively heavy, can be properly supported by two of the wafer supporting constructions 14 at temperatures of at least 100° C. Of importance is that edge contact with the wafers 74 is maintained as illustrated in FIG. 5. Also of importance is that the additional wafer supporting portions 56 are relatively short, thus substantially minimizing bending of the fin portion 44 as a whole. The wafer supporting constructions 14 are designed to remain sufficiently rigid even if virgin poly ethyl ethyl ketone is used. In general, for purposes of supporting a 300 mm wafer, the wafer supporting portion are preferably less than 33 mm in length if poly ethyl ethyl ketone is used.

Polybenzimidazole is capable of withstanding a temperature of at least 425° C. without being destroyed. A wafer supporting construction made of polybenzimidazole may therefore be designed differently because of extra rigidity at higher temperatures of the polybenzimidazole when compared to poly ethyl ethyl ketone. Poly ethyl ethyl ketone is however less expensive than polybenzimidazole. Polyphenylene can withstand a temperature of at least 220° C. without destruction. A wafer supporting construction made of polyphenylene may, however, be designed differently than the wafer supporting constructions 14 made of poly ethyl ethyl ketone as hereinbefore described, because of reduced rigidity of polyphenylene at high temperatures when compared to poly ethyl ethyl ketone.

The invention has been described with reference to a specific example only. It will be understood that the specific details of the invention can be modified without departing from the scope of the invention. For example, a fastener 70 is illustrated which mounts one of the wafer supporting constructions 14 to one of the support structures 18 or 20 by complimentarily engaging a shank 68 thereof with a threaded hole formed by an inner surface of the ring 38. The threaded shank 68 thus complimentarily engages with a formation on the wafer supporting construction 14. In another embodiment a support structure of a support frame of a wafer transfer cassette may have a first engaging information which is different to the threaded shank 68, and a bracket portion of a wafer supporting construction may have a second engaging formation which may be different to the threaded hole formed by the ring 38, and the first and second engaging informations may complimentarily engage with one another so as to mount the wafer supporting construction to the support structure.

While exemplary embodiments have been described and shown, the accompanying drawings, therefore, it is to be understood that such embodiments are merely illustrative and not restrictive of the current invention, and that this invention is not restricted to the specific constructions and derangements shown and described, since modifications may occur to those ordinarily skilled in the art.

What is claimed is:

1. A wafer transfer cassette comprising:
    a support frame including first and second vertically extending support structures which are horizontally spaced from one another;
    a first wafer supporting construction, secured to the first support structure having a first fin portion which extends from the first support structure towards the second support structure; and
    a second wafer supporting construction, secured to the second support structure, having a second fin portion which extends from the second support structure towards the first support structure, the first and second fin portions having upper surfaces positioned relative to one another to jointly support a wafer in substantially a horizontal orientation, wherein the first wafer supporting construction is made of a high temperature engineering plastics material which is a different material than the first support structure.

2. A wafer transfer cassette as in claim 1 wherein the first support structure is made of metal.

3. A wafer transfer cassettte as in claim 1 wherein the first fin portion has an upper surface for supporting the wafer, the upper surface sloping downwardly from the first support structure towards the second support structure.

4. A wafer transfer cassette as in claim 1 wherein the first support structure has a first engaging formation, and the first wafer supporting construction includes a first bracket portion having a second engaging formation which is engageable with the first engaging formation to mount the first bracket portion to the first support structure, the first fin portion being secured to the first bracket portion.

5. A wafer transfer cassette as in claim 1 wherein the upper surfaces of the first and second fin portions are spaced from one another so as to jointly be capable of supporting a wafer having a diameter of at least 300 millimeters.

6. A wafer transfer cassette comprising:
    a support frame including first and second vertically extending metal support structures which are horizontally spaced from one another;
    a first poly ethyl ethyl ketone wafer supporting construction comprising:
    a first bracket portion having a first opening formed therein;
    a first ring in the first opening having an outer surface which engages with the first opening, and an inner surface which is threaded; and
    a first fin portion extending from the first bracket portion;
    a first fastener which threadably engages with the inner surface of the first ring to secure the first bracket portion to the first support structure so that the first fin portion extends from the first bracket portion towards the second support structure;
    a second poly ethyl ethyl ketone wafer supporting construction comprising:
    a second bracket portion having a second opening formed therein;
    a second ring in the second opening having an outer surface which engages with the second opening and an inner surface which is threaded; and
    a second fin portion extending from the second bracket portion; and
    a second fastener which threadably engages with the inner surface of the second ring to secure the second bracket portion to the second support structure so that the second fin portion extends from the second support structure towards the first support structure, the first and second fin portions having upper surfaces positioned relative to one another so as to be capable of jointly supporting a wafer, having a diameter of at least 300 millimeters, in substantially a horizontal orientation.

* * * * *